United States Patent
Byun

(10) Patent No.: US 11,106,392 B2
(45) Date of Patent: Aug. 31, 2021

(54) MEMORY SYSTEM AND OPERATING METHOD THEREOF

(71) Applicant: SK hynix Inc., Gyeonggi-do (KR)

(72) Inventor: Eu-Joon Byun, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 16/444,107

(22) Filed: Jun. 18, 2019

(65) Prior Publication Data

US 2020/0142638 A1 May 7, 2020

(30) Foreign Application Priority Data

Nov. 6, 2018 (KR) .................. 10-2018-0135372

(51) Int. Cl.
*G06F 3/06* (2006.01)

(52) U.S. Cl.
CPC .......... *G06F 3/0659* (2013.01); *G06F 3/0604* (2013.01); *G06F 3/0632* (2013.01); *G06F 3/0673* (2013.01)

(58) Field of Classification Search
CPC . G11C 11/5628; G11C 16/0483; G11C 16/10; G11C 11/5671; G11C 2211/5641; G11C 2211/5621; G11C 16/20; G11C 7/1045; G06F 3/0659; G06F 3/0604; G06F 3/0632; G06F 3/0673
USPC ................. 711/154, 103; 365/185.03, 185.33
See application file for complete search history.

(56) References Cited

U.S. PATENT DOCUMENTS

| | | | |
|---|---|---|---|
| 2004/0236980 A1* | 11/2004 | Chen .................. | G06F 9/44573 713/600 |
| 2008/0172520 A1* | 7/2008 | Lee ..................... | G11C 11/5628 711/103 |
| 2012/0042120 A1* | 2/2012 | Ni .......................... | G06F 21/78 711/103 |
| 2016/0202910 A1* | 7/2016 | Ravimohan ......... | G06F 12/0607 711/103 |
| 2016/0313928 A1* | 10/2016 | Chun ................... | G06F 3/0679 |
| 2019/0179698 A1* | 6/2019 | Liu ....................... | G06F 3/0614 |
| 2019/0180824 A1* | 6/2019 | Hsu .................... | G11C 16/3436 |

FOREIGN PATENT DOCUMENTS

| | | |
|---|---|---|
| KR | 10-2015-0118778 | 10/2015 |
| KR | 10-2016-0050394 | 5/2016 |
| KR | 10-2016-0147744 | 12/2016 |
| KR | 10-2017-0113013 | 10/2017 |

* cited by examiner

*Primary Examiner* — Hashem Farrokh
(74) *Attorney, Agent, or Firm* — IP & T Group

(57) ABSTRACT

A data processing system includes: a host suitable for generating an initialization command and generating program mode information by selecting a program mode; a memory device including a plurality of memory cells storing a single level data and a multiple-level data; and a controller suitable for: receiving the initialization command and the program mode information from the host; controlling the memory device to perform an initialization operation on the memory device in response to the initialization command; and controlling the memory device to perform a program operation on the memory device based on the program mode information after the initialization operation is performed.

10 Claims, 13 Drawing Sheets

MEMORY SYSTEM AND OPERATING METHOD THEREOF

CROSS-REFERENCE TO RELATED APPLICATIONS

The present application claims priority under 35 U.S.C 119(a) to Korean Patent Application No. 10-2018-0135372, filed on Nov. 6, 2018, which is incorporated herein by reference in its entirety.

BACKGROUND

1. Field

Exemplary embodiments of the present invention relate to a data processing system, and more particularly, to a data processing system for determining a programming method of a flash memory directly by a user during an initialization operation, and a method for operating the data processing system.

2. Description of the Related Art

The computer environment paradigm has shifted to ubiquitous computing, which enables computing systems to be used anytime and anywhere. As a result, use of portable electronic devices such as mobile phones, digital cameras, and laptop computers has rapidly increased. These portable electronic devices generally use a memory system having one or more memory devices for storing data. A memory system may be used as a main memory device or an auxiliary memory device of a portable electronic device.

Memory systems provide excellent stability, durability, high information access speed, and low power consumption since they have no moving parts, as compared with a hard disk device. Examples of memory systems having such advantages include universal serial bus (USB) memory devices, memory cards having various interfaces, and solid state drives (SSDs).

SUMMARY

Embodiments of the present invention are directed to a data processing system in which a user directly selects a single level cell (SLC) program mode or a multi-level cell program mode at a moment when an initialization operation is performed and a program operation is performed according to the selected program mode.

In accordance with an embodiment of the present invention, a data processing system includes: a host suitable for generating an initialization command and generating program mode information by selecting a program mode; a memory device including a plurality of memory cells storing a single level data and a multiple-level data; and a controller suitable for: receiving the initialization command and the program mode information from the host; controlling the memory device to perform an initialization operation on the memory device in response to the initialization command; and controlling the memory device to perform a program operation on the memory device based on the program mode information after the initialization operation is performed.

In accordance with another embodiment of the present invention, a method for operating a data processing system includes: providing an initialization command and program mode information from a host; receiving the initialization command and the program mode information by a controller; performing an initialization operation on a memory device including a plurality of memory cells storing a single-level data and a multiple-level data, in response to the initialization command; and performing a program operation on the memory device based on the program mode information after the initialization operation is performed.

In accordance with an embodiment of the present invention, a data processing system includes: a host suitable for providing an initialization command and program mode information, which are inputted from a user; a memory device including a plurality of memory cells, which includes a single-level cell and a multiple-level cell; and a controller suitable for: receiving the initialization command and the program mode information from the host; controlling the memory device to perform an initialization operation on the memory device in response to the initialization command; and controlling the memory device to perform a program operation on one of the single-level cell and the multiple-level cell, which is determined based on the program mode information.

DETAILED DESCRIPTION

Figure 1:
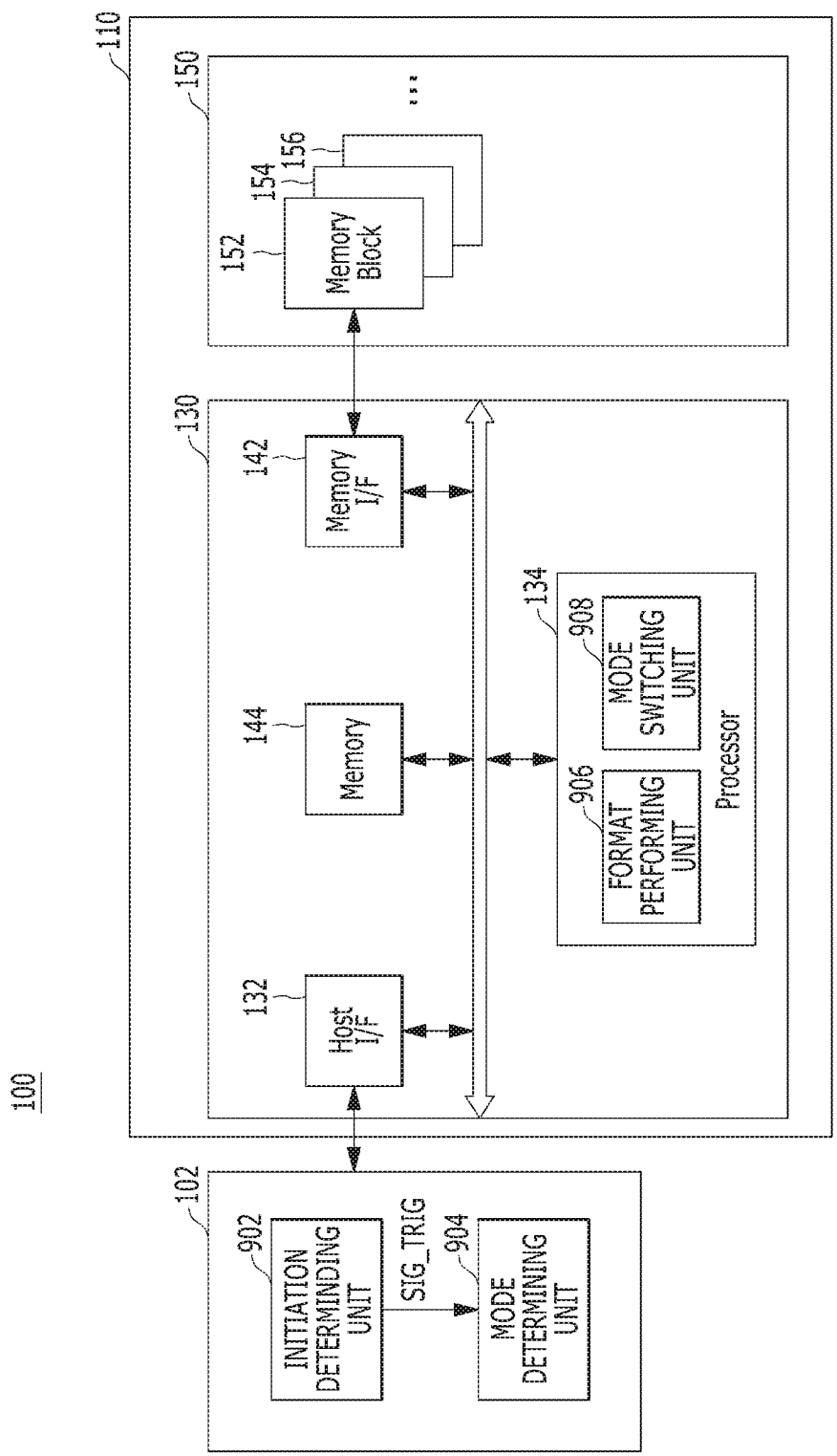
FIG. 1 is a block diagram illustrating a data processing system including a memory system in accordance with an embodiment of the present invention.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

It is noted that reference to "an embodiment" does not necessarily mean only one embodiment, and different references to "an embodiment" are not necessarily to the same embodiment(s).

It will be understood that, although the terms "first" and/or "second" may be used herein to describe various elements, these elements should not be limited by these terms. These terms are only used to distinguish one element, from another element. For instance, a first element discussed below could be termed a second element without departing from the teachings of the present disclosure. Similarly, the second element could also be termed the first element.

It will be understood that when an element is referred to as being "coupled" or "connected" to another element, it can be directly coupled or connected to the other element or intervening elements may be present therebetween. In contrast, it should be understood that when an element is referred to as being "directly coupled" or "directly connected" to another element, there are no intervening elements present. Other expressions that describe the relationship between elements, such as "between", "directly between", "adjacent to" or "directly adjacent to" should be construed in the same way.

The terminology used herein is for the purpose of describing particular embodiments only and is not intended to be limiting. In the present disclosure, the singular forms are intended to include the plural forms as well, unless the context clearly indicates otherwise. It will be further understood that the terms "comprise", "include", "have", etc. when used in this specification, specify the presence of stated features, numbers, steps, operations, elements, components, and/or combinations thereof but do not preclude the presence or addition of one or more other features, numbers, steps, operations, elements, components, and/or combinations thereof.

The above-described exemplary embodiments are merely for the purpose of understanding the technical spirit of the present disclosure and the scope of the present disclosure should not be limited to the above-described exemplary embodiments. It will be obvious to those skilled in the art to which the present disclosure pertains that other modifications based on the technical spirit of the present disclosure may be made in addition to the above-described exemplary embodiments.

Unless otherwise defined, all terms including technical and scientific terms used herein have the same meaning as commonly understood by one of ordinary skill in the art to which the present disclosure belongs. Unless otherwise defined in the present disclosure, the terms should not be construed as being ideal or excessively formal.

Hereinafter, the various embodiments of the present invention will be described in detail with reference to the attached drawings.

FIG. 1 is a block diagram illustrating a data processing system 100 including a memory system 110 in accordance with an embodiment of the present invention.

Referring to FIG. 1, the data processing system 100 may include a host 102 and the memory system 110.

The host 102 may include any of a variety of portable electronic devices such as a mobile phone, a MP3 player and a laptop computer, or any of a variety of non-portable electronic devices such as a desktop computer, a game machine, a television (TV) and a projector. As will be described later with reference to FIG. 9, the host 102 may include an initialization determining unit 902 and a program mode selecting unit 904.

The host 102 may include at least one operating system (OS) or a plurality of operating systems. The host 102 may execute an OS to perform an operation corresponding to a user's request on the memory system 110. Here, the host 102 may provide a plurality of commands corresponding to a user's request to the memory system 110. Thus, the memory system 110 may perform certain operations corresponding to the plurality of commands, that is, corresponding to the user's request. The OS may manage and control overall functions and operations of the host 102. The OS may support an operation between the host 102 and a user using the data processing system 100 or the memory system 110.

The memory system 110 may operate or perform a specific function or operation in response to a request from the host 102. Particularly, the memory system 110 may store data to be accessed by the host 102. The memory system 110 may be used as a main memory system or an auxiliary memory system of the host 102. The memory system 110 may be implemented with any one of various types of storage devices, which may be electrically coupled with the host 102, according to a protocol of a host interface. Non-limiting examples of the memory system 110 include a solid state drive (SSD), a multi-media card (MMC) and an embedded MMC (eMMC).

The memory system 110 may include various types of storage devices. Non-limiting examples of such storage devices include volatile memory devices such as a dynamic random access memory (DRAM) and a static RAM (SRAM) and nonvolatile memory devices such as a read only memory (ROM), a mask ROM (MROM), a programmable ROM (PROM), an erasable programmable ROM (EPROM), an electrically erasable programmable ROM (EEPROM), a ferroelectric RAM (FRAM), a phase-change RAM (PRAM), a magneto-resistive RAM (MRAM), a resistive RAM (RRAM), and a flash memory.

The memory system 110 may include a controller 130 and a memory device 150.

The controller 130 and the memory device 150 may be integrated into a single semiconductor device, which may be included in any of the various types of memory systems as described above. For example, the controller 130 and the memory device 150 may be integrated as a single semiconductor device to constitute an SSD, a personal computer memory card international association (PCMCIA) card, a secure digital (SD) card including a mini-SD, a micro-SD and a SDHC, and a universal flash storage (UFS) device. The memory system 110 may be configured as a part of a computer, a smart phone, a portable game player, or one of various components configuring a computing system.

The memory device 150 may be a nonvolatile memory device which may retain stored data even though power is not supplied. The memory device 150 may store data provided from the host 102 through a write operation, and output data stored therein to the host 102 through a read operation. In an embodiment, the memory device 150 may include a plurality of memory dies (not shown), and each memory die may include a plurality of planes (not shown). Each plane may include a plurality of memory blocks 152 to 156. Each of the plurality of memory blocks 152 to 156 may include a plurality of pages, each of which may include a plurality of memory cells coupled to a word line. In an embodiment, the memory device 150 may be a flash memory having a 3-dimensional (3D) stack structure.

The structure of the memory device 150 and the 3D stack structure of the memory device 150 will be described in detail below with reference to FIGS. 2 to 4.

The controller 130 may control the memory device 150 in response to a request from the host 102. For example, the controller 130 may provide data read from the memory device 150 to the host 102, and store data provided from the host 102 into the memory device 150. For this operation, the controller 130 may control read, write, program, and erase operations of the memory device 150.

More specifically, the controller 130 may include a host interface (I/F) 132, a processor 134, a memory interface 142, and a memory 144, all operatively coupled or engaged via an internal bus. As will be described later with reference to FIG. 9, the processor 134 may include a format performing unit 906 and a mode switching unit 908.

The host interface 132 may process a command and data of the host 102. The host interface 132 may communicate with the host 102 through one or more of various interface protocols such as universal serial bus (USB), multi-media card (MMC), peripheral component interconnect-express (PCI-e or PCIe), small computer system interface (SCSI), serial-attached SCSI (SAS), serial advanced technology attachment (SATA), parallel advanced technology attachment (PATA), enhanced small disk interface (ESDI) and integrated drive electronics (IDE). The host interface 132 may be driven via a firmware, that is, a host interface layer (HIL) for exchanging data with the host 102.

The memory interface 142 may serve as a memory/storage interface between the controller 130 and the memory device 150 such that the controller 130 may control the memory device 150 in response to a request from the host 102.

The memory 144 may serve as a working memory of the memory system 110 and the controller 130. That is, the memory 144 may store data for driving the memory system 110 and the controller 130.

The memory 144 may be a volatile memory. For example, the memory 144 may be a static random access memory (SRAM) or dynamic random access memory (DRAM). The memory 144 may be disposed within or external to the controller 130. FIG. 1 shows that the memory 144 is disposed within the controller 130. Alternatively, the memory 144 may be an external volatile memory having a memory interface for transferring data between the memory 144 and the controller 130.

As described above, the memory 144 may include a program memory, a data memory, a write buffer/cache, a read buffer/cache, a data buffer/cache and a map buffer/cache. The memory 144 may store some data required to perform data write and read operations between the host 102 and the memory device 150, and other data required for the controller 130 and the memory device 150 to perform these operations.

The processor 134 may control overall operations of the memory system 110. The processor 134 may use firmware to control the overall operations of the memory system 110. The firmware may be referred to as a flash translation layer (FTL). The processor 134 may be implemented with a microprocessor or a central processing unit (CPU).

For example, the controller 130 may perform an operation requested by the host 102 in the memory device 150 through the processor 134. Also, the controller 130 may perform a background operation on the memory device 150 through the processor 134. The background operation performed on the memory device 150 may include a garbage collection (GC) operation, a wear-leveling (WL) operation, a map flush operation, and a bad block management operation. The garbage collection operation may include an operation of copying and processing data stored in some memory blocks among the memory blocks 152 to 156 of the memory device 150 into other memory blocks. The wear-leveling operation may include an operation of performing swapping between the memory blocks 152 to 156 or between the data of the memory blocks 152 to 156. The map flush operation may include an operation of storing the map data stored in the controller 130 in the memory blocks 152 to 156. The bad block management operation may include an operation of managing bad blocks of the memory device 150. In other words, the bad block management operation may include an operation of detecting and processing bad blocks among the memory blocks 152 to 156 in the memory device 150.

The memory device of the memory system in accordance with an embodiment of the present invention is described in detail with reference to FIGS. 2 to 4.

Figure 2:
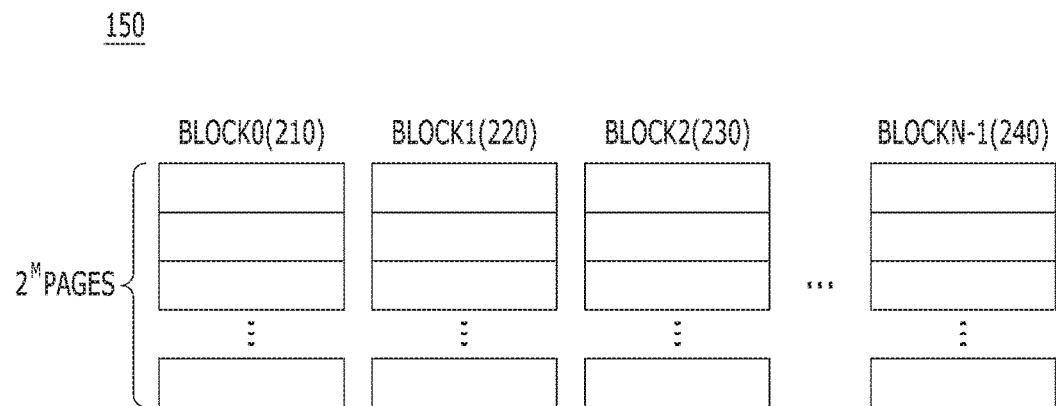
FIG. 2 is a diagram illustrating a memory device employed in the memory system shown in FIG. 1.

FIG. 2 is a schematic diagram illustrating the memory device 150 of FIG. 1. FIG. 3 is a circuit diagram illustrating an exemplary configuration of a memory cell array of a memory block 330 in the memory device 150 of FIG. 1. FIG. 4 is a schematic diagram illustrating an exemplary three-dimensional (3D) structure of the memory device 150 of FIG. 1.

Referring to FIG. 2, the memory device 150 may include a plurality of memory blocks BLOCK0 to BLOCKN−1, where N is an integer greater than 1. Each of the blocks BLOCK0 to BLOCKN−1 may include a plurality of pages, for example, $2^M$ or M pages, where M is an integer greater than 1. The number of each of the plurality of pages may vary according to circuit design. Each of the pages may include a plurality of memory cells that are coupled to a plurality of word lines WL.

Also, memory cells in the respective memory blocks BLOCK0 to BLOCKN−1 may be one or more of a single level cell (SLC) memory block storing 1-bit data or a multi-level cell (MLC) memory block storing 2-bit data. Hence, the memory device 150 may include SLC memory blocks or MLC memory blocks, depending on the number of bits which can be expressed or stored in each of the memory cells in the memory blocks. The SLC memory blocks may include a plurality of pages which are embodied by memory cells, each storing one-bit data. The SLC memory blocks may generally have higher data computing performance and higher durability than the MLC memory blocks. The MLC memory blocks may include a plurality of pages which are embodied by memory cells each storing multi-bit data (for example, 2 or more bits). The MLC memory blocks may generally have larger data storage space, that is, higher integration density, than the SLC memory blocks. In another embodiment, the memory device 150 may include a plurality of triple level cell (TLC) memory blocks. In yet another embodiment, the memory device 150 may include a plurality of quadruple level cell (QLC) memory blocks. The TCL memory blocks may include a plurality of pages which are embodied by memory cells each capable of storing 3-bit data. The QLC memory blocks may include a plurality of pages which are embodied by memory cells each capable of storing 4-bit data.

Instead of a nonvolatile memory, the memory device 150 may be implemented by any one of a phase change random access memory (PCRAM), a resistive random access memory (RRAM or ReRAM), a ferroelectrics random access memory (FRAM), and a spin transfer torque magnetic random access memory (STT-RAM or STT-MRAM).

The memory blocks 210, 220, 230, 240 may store the data received from the host 102 through a program operation, and may transfer data stored therein to the host 102 through a read operation.

Figure 3:
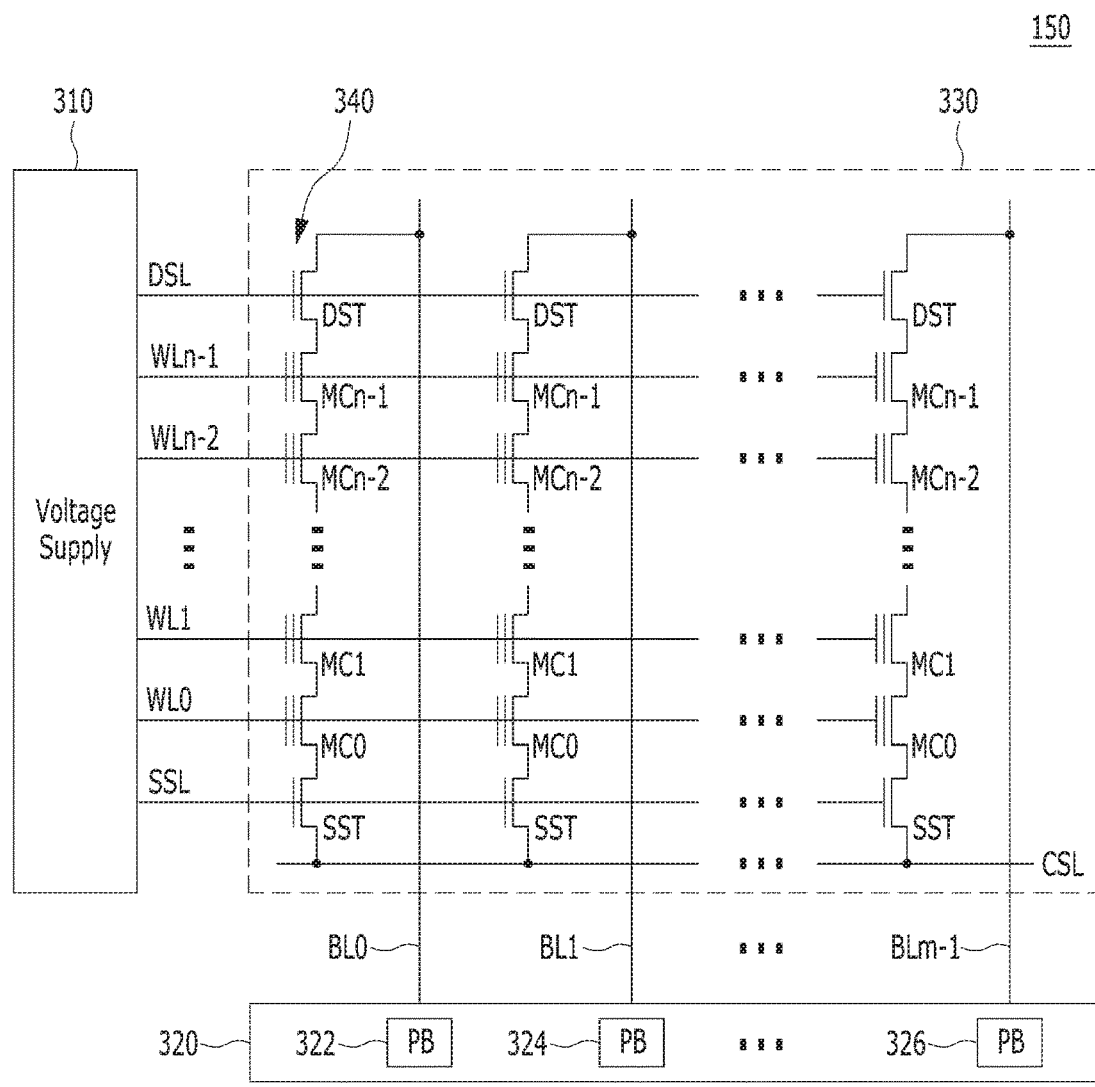
FIG. 3 is a circuit diagram illustrating a memory cell array of a memory block in the memory device shown in FIG. 1.
Figure 4:
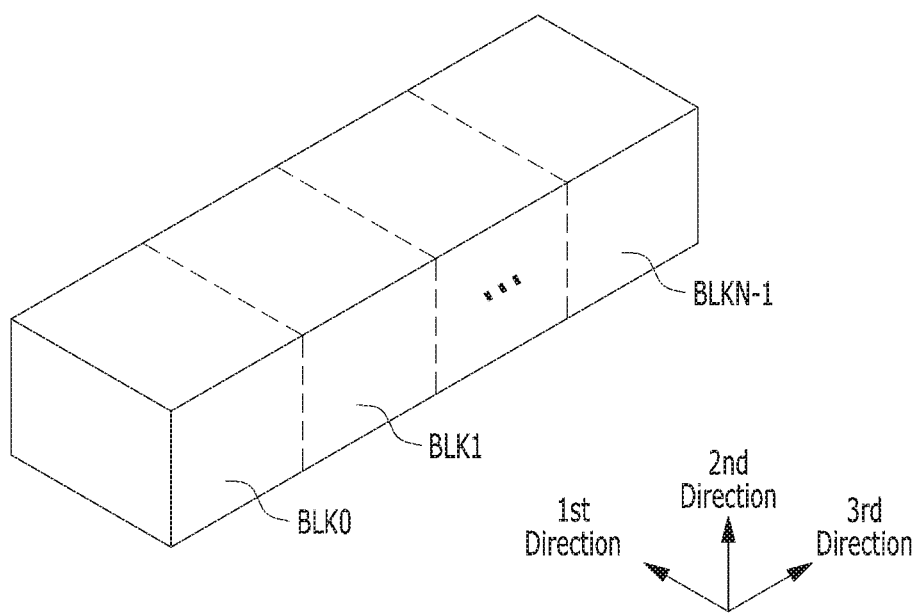
FIG. 4 is a block diagram illustrating a structure of a memory device of a memory system in accordance with an embodiment of the present invention.

Referring to FIG. 3, the memory block 330 may include a plurality of cell strings 340 coupled to a plurality of corresponding bit lines BL0 to BLm−1. The cell string 340 of each column may include one or more drain select transistors DST and one or more source select transistors SST. Between the drain and source select transistors DST and SST, a plurality of memory cells MC0 to MCn−1 may be coupled in series. In an embodiment, each of the memory cell transistors MC0 to MCn−1 may be embodied by an MLC capable of storing data information of a plurality of bits. Each of the cell strings 340 may be electrically coupled to a corresponding bit line among the plurality of bit lines BL0 to BLm−1. For example, as illustrated in FIG. 3, the first cell string is coupled to the first bit line BL0, and the last cell string is coupled to the last bit line BLm−1.

Although FIG. 3 illustrates NAND flash memory cells, the present disclosure is not limited thereto. It is noted that the memory cells may be NOR flash memory cells, or hybrid flash memory cells including two or more types of memory cells combined therein. Also, it is noted that the memory device 150 may be a flash memory device including a conductive floating gate as a charge storage layer or a charge trap flash (CTF) memory device including an insulation layer as a charge storage layer.

The memory device 150 may further include a voltage supply 310 which generates different word line voltages including a program voltage, a read voltage, and a pass voltage to supply to the word lines according to an operation mode. The voltage generation operation of the voltage supply 310 may be controlled by a control circuit (not illustrated). Under the control of the control circuit, the voltage supply 310 may select at least one of the memory blocks (or sectors) of the memory cell array, select at least one of the word lines of the selected memory block, and provide the word line voltages to the selected word line(s) and the unselected word lines as may be needed.

The memory device 150 may include a read and write (read/write) circuit 320 which is controlled by the control circuit. During a verification/normal read operation, the read/write circuit 320 may operate as a sense amplifier for reading (i.e., sensing and amplifying) data from the memory cell array. During a program operation, the read/write circuit 320 may operate as a write driver for supplying a voltage or a current to bit lines according to data to be stored in the memory cell array. During a program operation, the read/write circuit 320 may receive data to be stored into the memory cell array from a buffer (not illustrated), and drive bit lines according to the received data. The read/write circuit 320 may include a plurality of page buffers 322 to 326 respectively corresponding to columns (or bit lines) or column pairs (or bit line pairs). Each of the page buffers 322 to 326 may include a plurality of latches (not illustrated).

The memory device 150 may be embodied by a 2D or 3D memory device. Particularly, as illustrated in FIG. 4, the memory device 150 may be embodied by a nonvolatile memory device having a 3D stack structure. When the memory device 150 has a 3D structure, the memory device 150 may include a plurality of memory blocks BLK0 to BLKN−1. Herein, FIG. 4 is a block diagram illustrating the memory blocks 152, 154 and 156 of the memory device 150 shown in FIG. 1. Each of the memory blocks 152, 154 and 156 may be realized in a 3D structure (or vertical structure). For example, the memory blocks 152, 154 and 156 may include structures of a three-dimensional structure that are extended in first to third directions, e.g., an x-axis direction, a y-axis direction, and a z-axis direction.

Each memory block 330 included in the memory device 150 may include a plurality of NAND strings NS that are extended in the second direction, and a plurality of NAND strings NS that are extended in the first direction and the third direction. Herein, each of the NAND strings NS may be coupled to a bit line BL, at least one string selection line SSL, at least one ground selection line GSL, a plurality of word lines WL, at least one dummy word line DWL, and a common source line CSL, and each of the NAND strings NS may include a plurality of transistor structures TS.

In short, each memory block 330 among the memory blocks 152, 154 and 156 of the memory device 150 may be coupled to a plurality of bit lines BL, a plurality of string selection lines SSL, a plurality of ground selection lines GSL, a plurality of word lines WL, a plurality of dummy word lines DWL, and a plurality of common source lines CSL. Each memory block 330 may include a plurality of NAND strings NS. Also, in each memory block 330, one bit line BL may be coupled to a plurality of NAND strings NS to realize a plurality of transistors in one NAND string NS. Also, a string selection transistor SST of each NAND string NS may be coupled to a corresponding bit line BL, and a ground selection transistor GST of each NAND string NS may be coupled to a common source line CSL. Herein, memory cells MC may be provided between the string selection transistor SST and the ground selection transistor GST of each NAND string NS. In other words, a plurality of memory cells may be realized in each memory block 330 of the memory blocks 152, 154 and 156 of the memory device 150.

When a flash memory is used for a long time, the storage space of the memory device 150 may be filled with the user data that have been programmed into the memory device 150 while the flash memory was used. When the user does not need to store the user data occupying the storage space of the memory device 150 anymore in the memory device 150, the user may initialize the flash memory. The controller 130 may be able to initialize the flash memory by performing a format operation of deleting all the user data programmed into the memory device 150 upon receipt of an initialization command provided from the host 102.

Generally, since the user does not use all the storage capacity of a flash memory, the user may prefer a single-level cell (SLC) scheme that provides a higher program or read speed than a multi-level cell scheme that provides a larger storage capacity after the initialization of the flash memory. However, the user may not directly determine whether to perform a program operation based on a single-level cell (SLC) scheme or perform the program operation based on a multi-level cell scheme with respect to the user data which are to be programmed after the initialization of the flash memory. Thus, the preference of a user for the program scheme is not considered at a moment when the initialization operation begins.

According to one embodiment of the present invention, the controller 130 may control the memory device 150 to perform a program operation according to a program mode selected by the user at a moment when the initialization operation is performed (i.e., an initialization moment). For example, when the priority is given to the improvement in the speed of a program or read operation, rather than the increase in the storage capacity of a memory, the user may select the single-level cell (SLC) program mode at the initialization moment, and the controller 130 may control the memory device 150 to perform a program operation according to the single-level cell (SLC) scheme. Conversely, when the priority is given to obtaining the storage space of the memory rather than the improvement in the speed of a program or read operation, the user may select a multi-level cell program mode at the initialization moment. The controller 130 may control the memory device 150 to perform a program operation according to the multi-level cell program mode.

Figure 5:
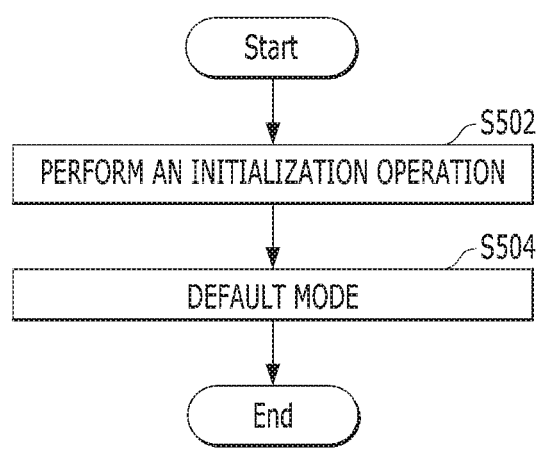
FIG. 5 is a flowchart illustrating a conventional initialization operation.

FIG. 5 is a flowchart illustrating a conventional initialization operation. The initialization operation of FIG. 5 may be performed by the controller 130 in FIG. 1.

Referring to FIG. 5, at step S502, the controller 130 may control the memory device 150 to perform an initialization operation according to an initialization command CMD_INIT which is received from the host 102. The controller 130 may control an initialization operation of restoring the memory device 150 into the initial state by performing a format operation of deleting all the user data stored in the memory device 150. Generally, the user may decide only whether or not to perform an initialization operation, and the user may not be able to decide whether to perform a program operation according to a single-level cell (SLC) scheme or a multi-level cell scheme. Therefore, the host 102 may only provide the initialization command CMD_INIT to the controller 130.

At step S504, when the initialization operation performed at the step S502 is completed, the controller 130 may control the memory device 150 to perform a program operation according to a default mode DEFAULT MODE. The default mode DEFAULT MODE may be a program mode based on a predetermined criterion at the moment of manufacturing. For example, the controller 130 may control a program operation based on the default mode DEFAULT MODE. In other words, the controller 130 may perform a program operation according to a single-level cell (SLC) scheme for particular data, and perform a program operation according to a multi-level cell (MLC) scheme for other user data. For another example, when the number of free blocks is less than or equal to a predetermined threshold value while a program operation is performed according to the single-level cell (SLC) scheme, the controller 130 may control a program operation based on the multi-level cell scheme.

As described above, the default mode DEFAULT MODE is a scheme for the controller 130 to dynamically determine a program operation a based on a predetermined criterion. Thus, since the controller 130 controls the memory device 150 to perform a program operation based on the default mode DEFAULT MODE after an initialization operation. The memory device 150 may not perform a program operation according to the single-level cell (SLC) scheme for all user data, even though the user prefers the improvement in the speed of a program or read operation, and enhancing the reliability of data.

As described below, according to an embodiment of the present invention, the user may determine a program mode for user data to be programmed after the initialization at a initialization moment when the initialization of the memory device 150 is determined. The controller 130 may control the memory device 150 to perform a program operation according to the program mode selected by the user after the initialization operation is performed. The controller 130 may control the memory device 150 to perform the program operation, based on program mode information INFO_MODE provided along with the initialization command CMD_INIT from the host 102.

Figure 6:
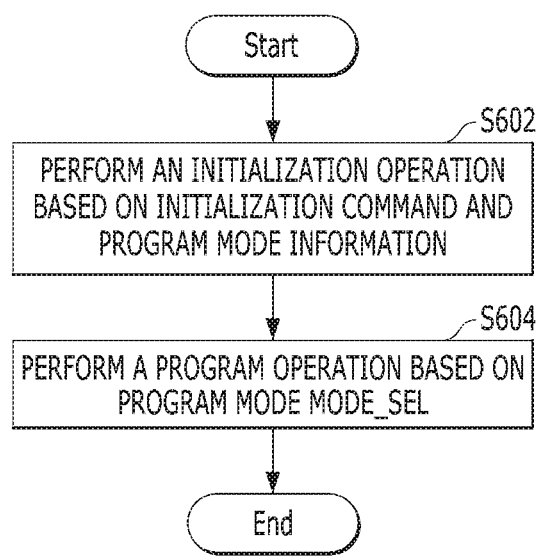
FIG. 6 is a flowchart illustrating an operation of a data processing system in accordance with an embodiment of the present invention.

FIG. 6 is a flowchart illustrating an operation of a data processing system 100 in accordance with an embodiment of the present invention.

Referring to FIG. 6, at step S602, the controller 130 may control the memory device 150 to perform an initialization operation based on the initialization command CMD_INIT and the program mode information INFO_MODE that are provided from the host 102. According to an embodiment of the present invention, when the user determines whether or not to perform an initialization operation, the user may decide whether to perform a program operation according to a single-level cell (SLC) scheme or to perform a program operation according to a multi-level cell scheme for the user data to be programmed after the initialization operation. Therefore, the host 102 may provide the controller 130 with the program mode information INFO_MODE along with the initialization command CMD_INIT. The controller 130 may control an initialization operation of restoring the memory device 150 into the initial state. In other words, the controller 130 may perform a format operation of deleting all the user data stored in the memory device 150 according to the provided initialization command CMD_INIT.

At step S604, the controller 130 may control the memory device 150 to perform a program operation based on the program mode MODE_SEL. The program mode MODE_SEL may be selected by the user based on the program mode information INFO_MODE at the step S602. For example, when the program mode MODE_SEL is a single-level cell (SLC) scheme, the controller 130 may control the memory device 150 to program the user data according to the single-level cell (SLC) scheme after the initialization operation. When the program mode MODE_SEL selected by the user is a multi-level cell scheme, the controller 130 may control the memory device 150 to program the user data according to the multi-level cell scheme after the initialization operation.

Figure 7:
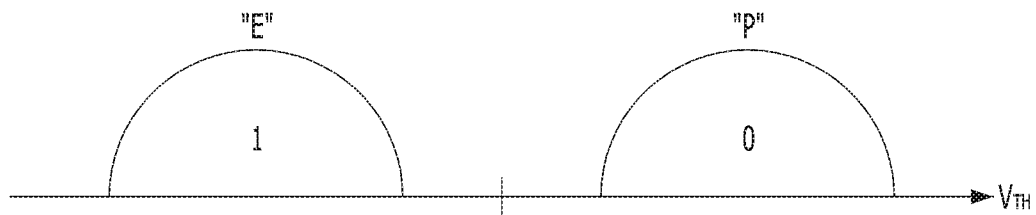
FIG. 7 is a diagram illustrating a program operation according to a single-level cell scheme.

FIG. 7 is a diagram illustrating a program operation according to a single-level cell (SLC) scheme.

FIG. 7 illustrates a cell distribution of single-level cells, which may have either an erase state E or a program state P. All memory cells may have an erase state E before a program operation is performed. When the program mode MODE_SEL selected by the user is a single-level cell (SLC) program mode based on the program mode information INFO_MODE provided from the host 102, the controller 130 may switch the memory blocks included in the memory device 150 into single-level cell (SLC) memory blocks, which are described above with reference to FIG. 2. The controller 130 may control the user data to be programmed into a page formed of single-level cells (SLC) included in a single-level cell (SLC) memory block. The controller 130 may control the memory device 150 to perform a program operation such that the memory cells having a logic value of 0 are in a program state P and the memory cells having a logic value of 1 are in an erase state E.

Figure 8:
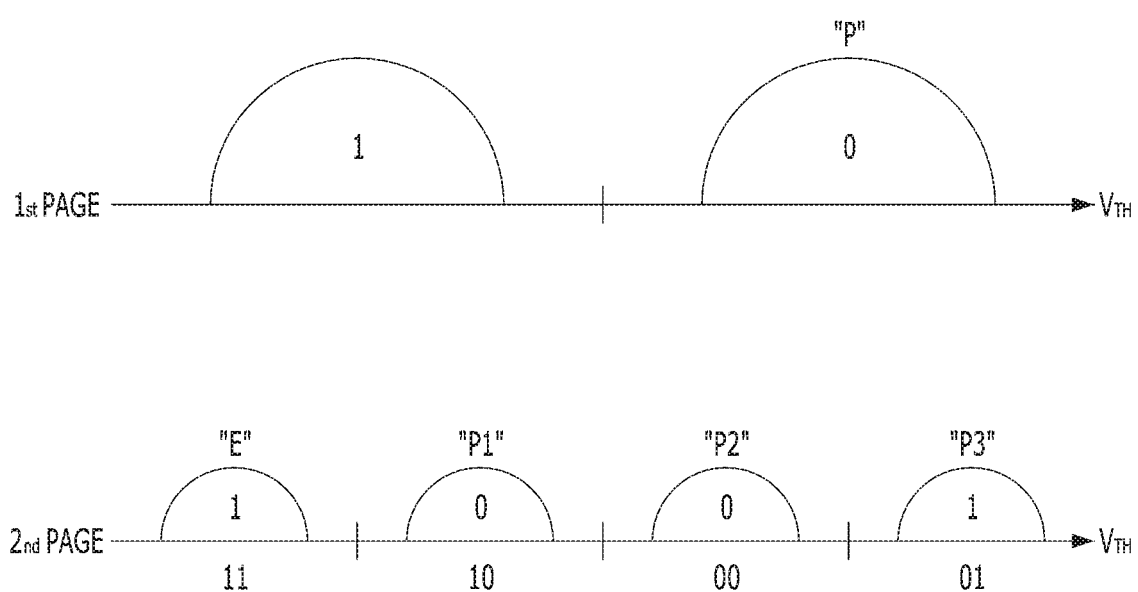
FIG. 8 is a diagram illustrating a program operation according to a multi-level cell scheme.

FIG. 8 is a diagram illustrating a program operation according to a multi-level cell (MLC) scheme.

FIG. 8 illustrates a cell distribution of multi-level cells, which may have one state among an erase state E, a first program state P1, a second program state P2, and a third program state P3. Just as the single-level cells SLC described above with reference to FIG. 7, all the memory cells may have an erase state E before a program operation is performed. When the program mode MODE_SEL is a multi-level cell program mode based on the program mode information INFO_MODE, the controller 130 may select, among the memory blocks included in the memory device 150, multi-level cell memory blocks.

One multi-level cell may store data represented by upper and lower bits. The page storing the upper bit and the page storing the lower bit may include memory cells connected to a physically identical word line. However, pages formed of the multi-level cells may be logically divided into a first page storing the upper bit and a second page storing the lower bit.

The controller 130 may control programming the lower bit into the second page after programming the upper bit into the first page. The controller 130 may control the program operation of the memory device 150 such that the memory cells having a logic value of 0 is in a program state P and the memory cells having a logic value of 1 is in an erase state E for the first page. The controller 130 may control the program operation of the memory device 150 such that memory cells in the first page and in the second page have a certain state based on logic values thereof. For example, the memory cells having a logic value of 1 in the first page and having a logic value of 1 in the second page are maintained in an erase state E. The memory cells having a logic value of 1 in the first page and having a logic value of 0 in the second page are in a first program state P1. The memory cells having a logic value of 0 in the first page and having a logic value of 0 in the second page are in a second program state P2. The memory cells having a logic value of 0 in the first page and having a logic value of 1 in the second page are in a third program state P3.

Figure 9:
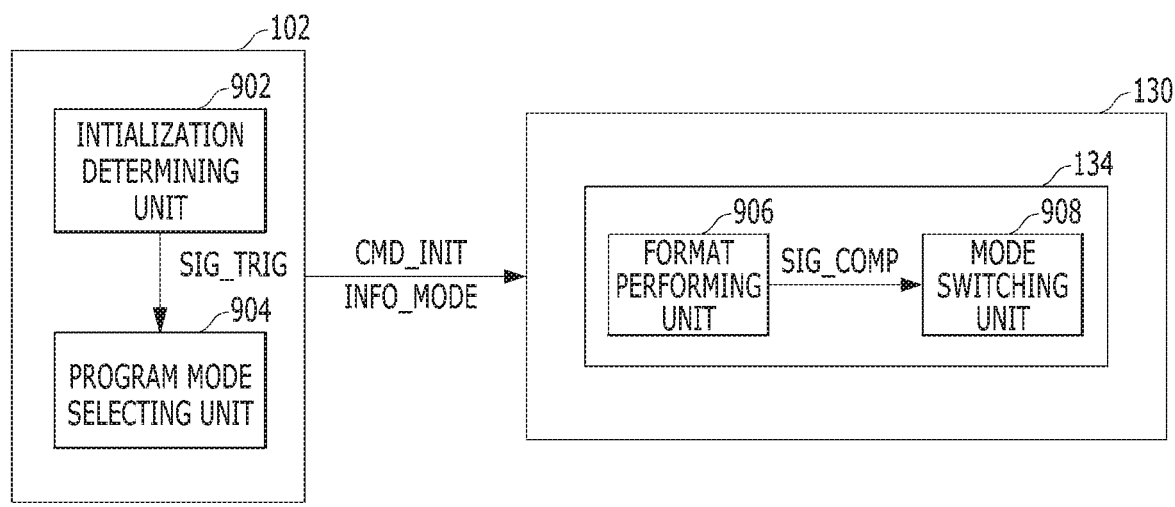
FIG. 9 is a block diagram illustrating a data processing system in accordance with an embodiment of the present invention.

FIG. 9 is a block diagram illustrating a data processing system 100 including a host 102 and a controller 130, in accordance with an embodiment of the present invention.

Referring to FIG. 9, the host 102 may include an initialization determining unit 902 and a program mode selecting unit 904. In addition, the processor 134 of the controller 130 may include a format performing unit 906 and a mode switching unit 908.

The initialization determining unit 902 may determine whether or not to perform an initialization operation for the memory device 150. The initialization determining unit 902 may be implemented with an initialization button. The user may trigger an initialization operation to be performed for the memory device 150 by pressing the initialization button. When the initialization determining unit 902 determines to perform an initialization operation, the initialization determining unit 902 may provide a trigger signal SIG_TRIG to the program mode selecting unit 904 and provide an initialization command CMD_INIT to the format performing unit 906.

The program mode selecting unit 904 may select the program operation mode of the memory device 150 based on the provided trigger signal SIG_TRIG. The program mode selecting unit 904 may be implemented with at least one button (e.g., an SLC button, an MLC button, a TLC button and a QLC button) like the initialization determining unit 902. For example, the user may determine that the controller 130 controls the memory device 150 to perform a program operation according to a single-level cell (SLC) scheme by pressing the SLC button. The user may determine that the controller 130 controls the memory device 150 to perform a program operation according to the multi-level cell (MLC) scheme of the memory device 150 by pressing the MLC button. The user may determine that the controller 130 controls the memory device 150 to perform a program operation according to a triple level cell (TLC) scheme by pressing the TLC button. The user may determine that the controller 130 controls the memory device 150 to perform a program operation according to a quadruple level cell (QLC) scheme by pressing the QLC button. The program mode selecting unit 904 may provide the mode switching unit 908 with the program mode information INFO_MODE when the program mode is determined.

The format performing unit 906 may control the memory device 150 to perform an initialization operation based on the provided initialization command CMD_INIT. The format performing unit 906 may control an initialization operation. The initialization operation may include an operation of restoring the memory device 150 into an initial state by performing a format operation. The format operation may include an operation of deleting all of the user data stored in the memory device 150. When the format operation is completed, the format performing unit 906 may provide the mode switching unit 908 with a complete signal SIG_COMP.

The mode switching unit 908 may control the memory device 150 to perform a program operation according to the program mode MODE_SEL. The program mode MODE_SEL may be selected by the user based on the provided program mode information INFO_MODE and the complete signal SIG_COMP. When the program mode MODE_SEL is a single-level cell (SLC) program mode based on the provided program mode information INFO_MODE, the mode switching unit 908 may control the memory device 150 to program user data according to the single-level cell (SLC) scheme. When the program mode MODE_SEL is a multi-level cell (MLC) program mode based on the provided program mode information INFO_MODE, the mode switching unit 908 may control the memory device 150 to program the user data according to the multi-level cell scheme after the initialization operation.

According to an embodiment of the present invention, when determining whether or not to perform an initialization operation, for the user data to be programmed after the initialization operation, the user may decide whether to perform a program operation according to a single-level cell (SLC) scheme or to perform a program operation according to a multi-level cell scheme. Therefore, since the host 102 may be able to provide the program mode information INFO_MODE as well as the initialization command CMD_INIT to the controller 130, the memory device 150 may be able to perform a program operation based on the program mode selected by the user after the initialization operation. For example, when priority is given to the speed of a program or read operation and the reliability of data, the user may select the program mode according to a single-level cell (SLC) scheme at an initialization moment when the execution of an initialization operation is determined. According to the determined program mode, the controller 130 may control the memory device 150 to perform a program operation according to the single-level cell (SLC) scheme after the initialization operation. Conversely, when priority is given to the data capacity, the user may select a program mode according to a multi-level cell scheme. According to the determined program mode, the controller 130 may control the memory device 150 to perform a program operation according to the multi-level cell scheme after the initialization operation.

Hereafter, a data processing system and electronic devices to which the memory system 110 including the memory device 150 and the controller 130, which are described above by referring to FIGS. 1 to 9, in accordance with embodiments of the present invention will be described in detail with reference to FIGS. 10 to 18.

Figure 10:
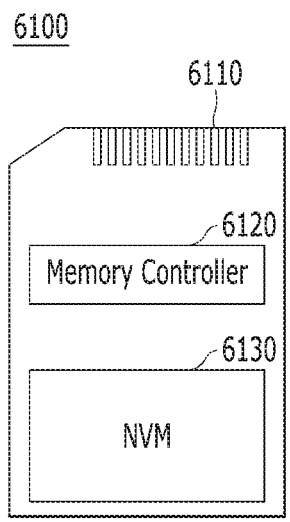
FIGS. 10 to 18 are diagrams illustrating exemplary applications of a data processing system in accordance with various embodiments of the present invention.

FIG. 10 is a diagram illustrating another example of a data processing system including a memory system in accordance with an embodiment. For example, FIG. 10 illustrates a memory card system 6100 to which the memory system may be applied.

Referring to FIG. 10, the memory card system 6100 may include a memory controller 6120, a memory device 6130 and a connector 6110.

More specifically, the memory controller 6120 may be electrically connected to, and configured to access, the memory device 6130 embodied by a nonvolatile memory (NVM). For example, the memory controller 6120 may be configured to control read, write, erase, and background operations of the memory device 6130. The memory controller 6120 may be configured to provide an interface between the memory device 6130 and an external device (e.g., the host 102 of FIG. 1), and to use firmware for controlling the memory device 6130. That is, the memory controller 6120 may correspond to the controller 130 of the memory system 110 described with reference to FIG. 1, and the memory device 6130 may correspond to the memory device 150 of the memory system 110 described with reference to FIG. 1.

Thus, the memory controller 6120 may include a random access memory (RAM), a processor, a host interface, a memory interface, and an error correction component.

The memory controller 6120 may communicate with the external device through the connector 6110. For example, as described with reference to FIG. 1, the memory controller 6120 may be configured to communicate with an external device through one or more various communication protocols such as universal serial bus (USB), multimedia card (MMC), embedded MMC (eMMC), peripheral component interconnection (PCI), PCI express (PCIe), advanced technology attachment (ATA), serial-ATA, parallel-ATA, small computer system interface (SCSI), enhanced small disk interface (EDSI), integrated drive electronics (IDE), Firewire, universal flash storage (UFS), wireless fidelity (Wi-Fi or WiFi) and Bluetooth. Thus, the memory system and the data processing system in accordance with the present embodiment may be applied to wired/wireless electronic devices or specific mobile electronic devices.

The memory device 6130 may be implemented by a nonvolatile memory (NVM). For example, the memory device 6130 may be implemented by any of various nonvolatile memory devices such as an erasable and programmable ROM (EPROM), an electrically erasable and programmable ROM (EEPROM), a NAND flash memory, a NOR flash memory, a phase-change RAM (PRAM), a resistive RAM (ReRAM), a ferroelectric RAM (FRAM) and a spin torque transfer magnetic RAM (STT-RAM).

The memory controller 6120 and the memory device 6130 may be integrated into a single semiconductor device to form a solid-state drive (SSD). Also, the memory controller 6120 and the memory device 6130 may be so integrated to form a memory card such as a PC card (personal computer memory card international association (PCMCIA)), a compact flash (CF) card, a smart media card (e.g., a SM and a SMC), a memory stick, a multimedia card (e.g., a MMC, a RS-MMC, a MMCmicro and an eMMC), a secure digital (SD) card (e.g., a SD, a miniSD, a microSD and a SDHC), and/or a universal flash storage (UFS).

Figure 11:
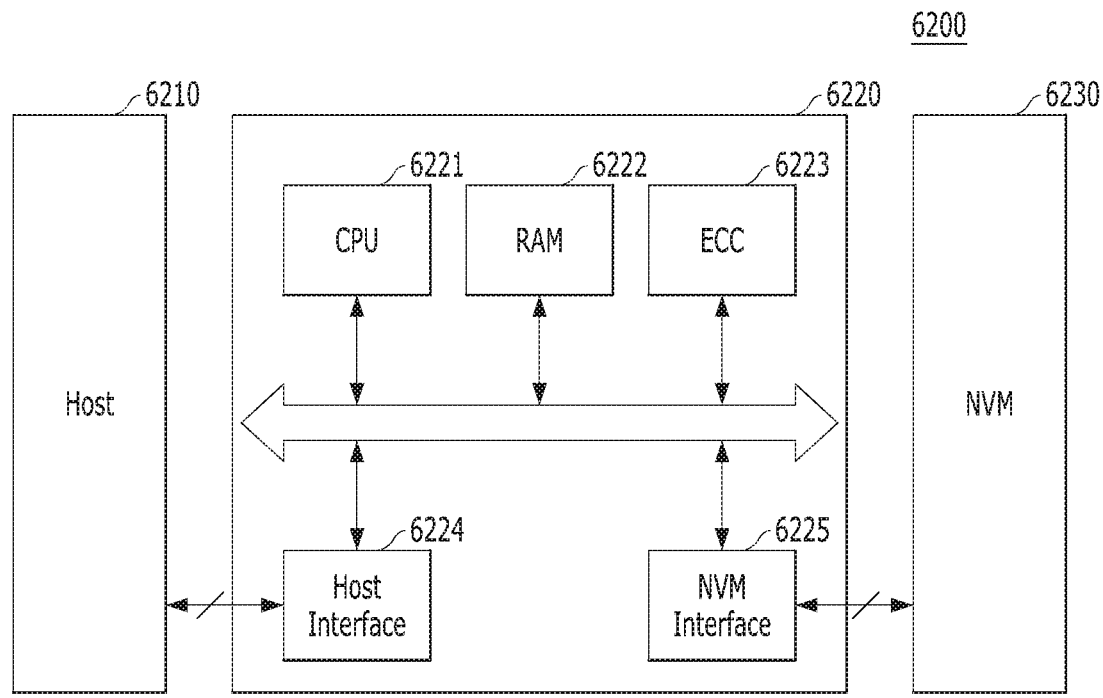

FIG. 11 is a diagram illustrating another example of a data processing system 6200 including a memory system in accordance with an embodiment.

Referring to FIG. 11, the data processing system 6200 may include a memory device 6230 having one or more nonvolatile memories (NVMs) and a memory controller 6220 for controlling the memory device 6230. The data processing system 6200 illustrated in FIG. 11 may serve as a storage medium such as a memory card (e.g., CF, SD, micro-SD or the like) or USB device, as described with reference to FIG. 1. The memory device 6230 may correspond to the memory device 150 in the memory system 110 illustrated in FIG. 1, and the memory controller 6220 may correspond to the controller 130 in the memory system 110 illustrated in FIG. 1.

The memory controller 6220 may control a read, write or erase operation on the memory device 6230 in response to a request of the host 6210. The memory controller 6220 may include one or more central processing units (CPUs) 6221, a buffer memory such as a random access memory (RAM) 6222, an error correction code (ECC) circuit 6223, a host interface 6224, and a memory interface such as a nonvolatile memory (NVM) interface 6225.

The CPU 6221 may control overall operations on the memory device 6230, for example, read, write, file system management, and bad page management operations. The RAM 6222 may be operated according to control of the CPU 6221, and used as a work memory, buffer memory or cache memory. When the RAM 6222 is used as a work memory, data processed by the CPU 6221 may be temporarily stored in the RAM 6222. When the RAM 6222 is used as a buffer memory, the RAM 6222 may be used for buffering data transmitted to the memory device 6230 from the host 6210 or vice versa. When the RAM 6222 is used as a cache memory, the RAM 6222 may assist the low-speed memory device 6230 to operate at high speed.

The ECC circuit 6223 may generate an error correction code (ECC) for correcting a failed bit or error bit of data provided from the memory device 6230. The ECC circuit 6223 may perform error correction encoding on data provided to the memory device 6230, thereby forming data with a parity bit. The parity bit may be stored in the memory device 6230. The ECC circuit 6223 may perform error correction decoding on data outputted from the memory device 6230. The ECC circuit 6223 may correct an error using the parity bit. The ECC circuit 6223 may correct an error using the low density parity check (LDPC) code, Bose-Chaudhri-Hocquenghem (BCH) code, turbo code, Reed-Solomon (RS) code, convolution code, recursive systematic code (RSC) or coded modulation such as trellis coded modulation (TCM) or block coded modulation (BCM).

The memory controller 6220 may transmit/receive data to/from the host 6210 through the host interface 6224. The memory controller 6220 may transmit/receive data to/from the memory device 6230 through the NVM interface 6225. The host interface 6224 may be connected to the host 6210 through a parallel advanced technology attachment (PATA) bus, a serial advanced technology attachment (SATA) bus, a small computer system interface (SCSI), a universal serial bus (USB), a peripheral component interconnect-express (PCIe) or a NAND interface. The memory controller 6220 may have a wireless communication function with a mobile communication protocol such as wireless fidelity (WiFi) or long term evolution (LTE). The memory controller 6220 may be connected to an external device, for example, the host 6210 or another external device, and then transmit/receive data to/from the external device. In particular, as the memory controller 6220 is configured to communicate with the external device according to one or more of various communication protocols, the memory system and the data processing system in accordance with an embodiment may be applied to wired/wireless electronic devices, particularly a mobile electronic device.

Figure 12:
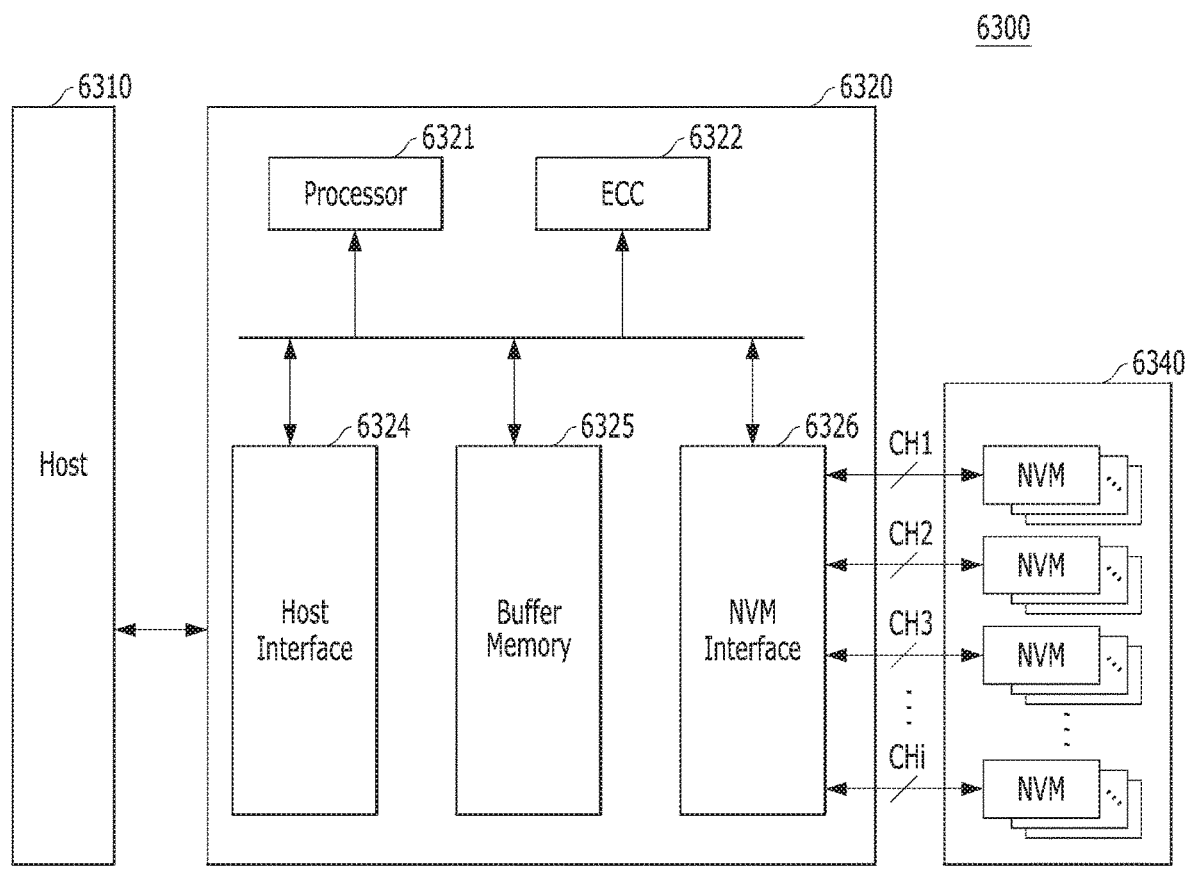

FIG. 12 is a diagram illustrating another example of a data processing system including a memory system in accordance with an embodiment. For example, FIG. 12 illustrates a solid state drive (SSD) 6300 to which the memory system may be applied.

Referring to FIG. 12, the SSD 6300 may include a controller 6320 and a memory device 6340 including a plurality of nonvolatile memories (NVMs). The controller 6320 may correspond to the controller 130 in the memory system 110 of FIG. 1, and the memory device 6340 may correspond to the memory device 150 in the memory system of FIG. 1.

More specifically, the controller 6320 may be connected to the memory device 6340 through a plurality of channels CH1 to CHi. The controller 6320 may include one or more processors 6321, an error correction code (ECC) circuit 6322, a host interface 6324, a buffer memory 6325 and a memory interface, for example, a nonvolatile memory interface 6326.

The buffer memory 6325 may temporarily store data provided from the host 6310 or data provided from a plurality of flash memories NVM included in the memory device 6340. Further, the buffer memory 6325 may temporarily store meta data of the plurality of flash memories NVM, for example, map data including a mapping table. The buffer memory 6325 may be embodied by any of a variety of volatile memories such as a dynamic random access memory (DRAM), a synchronous DRAM (SDRAM), a double data rate (DDR) SDRAM, a low power DDR (LPDDR) SDRAM and a graphics RAM (GRAM) or nonvolatile memories such as a ferroelectric RAM (FRAM), a resistive RAM (RRAM or ReRAM), a spin-transfer torque magnetic RAM (STT-MRAM) and a phase-change RAM (PRAM). FIG. 12 illustrates that the buffer memory 6325 is embodied in the controller 6320. However, the buffer memory 6325 may be external to the controller 6320.

The ECC circuit 6322 may calculate an error correction code (ECC) value of data to be programmed to the memory device 6340 during a program operation, perform an error correction operation on data read from the memory device 6340 based on the ECC value during a read operation, and perform an error correction operation on data recovered from the memory device 6340 during a failed data recovery operation.

The host interface 6324 may provide an interface function with an external device, for example, the host 6310, and the nonvolatile memory interface 6326 may provide an interface function with the memory device 6340 connected through the plurality of channels.

Furthermore, a plurality of SSDs 6300 to which the memory system 110 of FIG. 1 may be applied may be provided to embody a data processing system, for example, a redundant array of independent disks (RAID) system. The RAID system may include the plurality of SSDs 6300 and a RAID controller for controlling the plurality of SSDs 6300. When the RAID controller performs a program operation in response to a write command provided from the host 6310, the RAID controller may select one or more memory systems or SSDs 6300 according to a plurality of RAID levels, that is, RAID level information of the write command provided from the host 6310 in the SSDs 6300, and output data corresponding to the write command to the selected SSDs 6300. Furthermore, when the RAID controller performs a read command in response to a read command provided from the host 6310, the RAID controller may select one or more memory systems or SSDs 6300 according to a plurality of RAID levels, that is, RAID level information of the read command provided from the host 6310 in the SSDs 6300, and provide data read from the selected SSDs 6300 to the host 6310.

Figure 13:
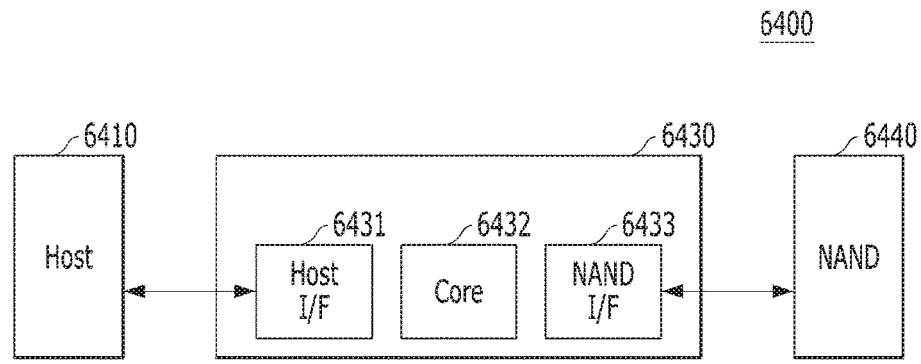

FIG. 13 is a diagram illustrating another example of a data processing system including a memory system in accordance with an embodiment. For example, FIG. 13 illustrates an embedded multi-media card (eMMC) 6400 to which the memory system may be applied.

Referring to FIG. 13, the eMMC 6400 may include a controller 6430 and a memory device 6440 embodied by one or more NAND flash memories. The controller 6430 may correspond to the controller 130 in the memory system 110 of FIG. 1. The memory device 6440 may correspond to the memory device 150 in the memory system 110 of FIG. 1.

More specifically, the controller 6430 may be connected to the memory device 6440 through a plurality of channels. The controller 6430 may include one or more cores 6432, a host interface 6431 and a memory interface, for example, a NAND interface 6433.

The core 6432 may control overall operations of the eMMC 6400, the host interface 6431 may provide an interface function between the controller 6430 and the host 6410, and the NAND interface 6433 may provide an interface function between the memory device 6440 and the controller 6430. For example, the host interface 6431 may serve as a parallel interface, for example, MMC interface as described with reference to FIG. 1. Furthermore, the host interface 6431 may serve as a serial interface, for example, an ultra high speed (UHS)-I/UHS-II) interface.

FIGS. 14 to 17 are diagrams illustrating other examples of a data processing system including a memory system in accordance with embodiments. For example, FIGS. 14 to 17 illustrate universal flash storage (UFS) systems 6500, 6600, 6700 and 6800, to which the memory system may be applied.

Referring to FIGS. 14 to 17, the UFS systems 6500, 6600, 6700, 6800 may include hosts 6510, 6610, 6710, 6810, UFS devices 6520, 6620, 6720, 6820 and UFS cards 6530, 6630, 6730, 6830, respectively. The hosts 6510, 6610, 6710, 6810 may serve as application processors of wired/wireless electronic devices, particularly mobile electronic devices, the UFS devices 6520, 6620, 6720, 6820 may serve as embedded UFS devices, and the UFS cards 6530, 6630, 6730, 6830 may serve as external embedded UFS devices or removable UFS cards.

The hosts 6510, 6610, 6710, 6810, the UFS devices 6520, 6620, 6720, 6820 and the UFS cards 6530, 6630, 6730, 6830 in the respective UFS systems 6500, 6600, 6700, 6800 may communicate with external devices, for example, wired/wireless electronic devices, particularly mobile electronic devices, through UFS protocols, and the UFS devices 6520, 6620, 6720, 6820 and the UFS cards 6530, 6630, 6730, 6830 may be embodied by the memory system 110 illustrated in FIG. 1. For example, in the UFS systems 6500, 6600, 6700, 6800, the UFS devices 6520, 6620, 6720, 6820 may be embodied in the form of the data processing system 6200, the SSD 6300 or the eMMC 6400 described with reference to FIGS. 11 to 13, and the UFS cards 6530, 6630, 6730, 6830 may be embodied in the form of the memory card system 6100 described with reference to FIG. 10.

Furthermore, in the UFS systems 6500, 6600, 6700, 6800, the hosts 6510, 6610, 6710, 6810, the UFS devices 6520, 6620, 6720, 6820 and the UFS cards 6530, 6630, 6730, 6830 may communicate with each other through an UFS interface, for example, MIPI M-PHY and MIPI unified protocol (UniPro) in mobile industry processor interface (MIPI). Furthermore, the UFS devices 6520, 6620, 6720, 6820 and the UFS cards 6530, 6630, 6730, 6830 may communicate with each other through any of various protocols other than the UFS protocol, for example, universal storage bus (USB) Flash Drives (UFDs), a multi-media card (MMC), a secure digital (SD), a mini-SD, and a micro-SD.

Figure 14:
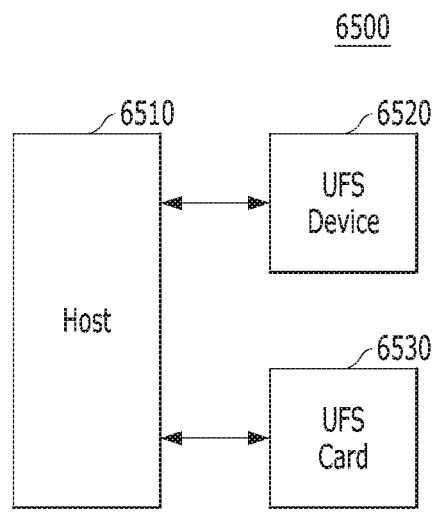

In the UFS system 6500 illustrated in FIG. 14, each of the host 6510, the UFS device 6520 and the UFS card 6530 may include UniPro. The host 6510 may perform a switching operation to communicate with the UFS device 6520 and the UFS card 6530. In particular, the host 6510 may communicate with the UFS device 6520 or the UFS card 6530 through link layer switching, for example, L3 switching at the UniPro. The UFS device 6520 and the UFS card 6530 may communicate with each other through link layer switching at the UniPro of the host 6510. In the illustrated embodiment, one UFS device 6520 and one UFS card 6530 are connected to the host 6510. However, a plurality of UFS devices and UFS cards may be connected in parallel or in the form of a star to the host 6410. A star formation is an arrangement in which a single device is coupled with plural devices for centralized operation. A plurality of UFS cards may be connected in parallel or in the form of a star to the UFS device 6520 or connected in series or in the form of a chain to the UFS device 6520.

Figure 15:
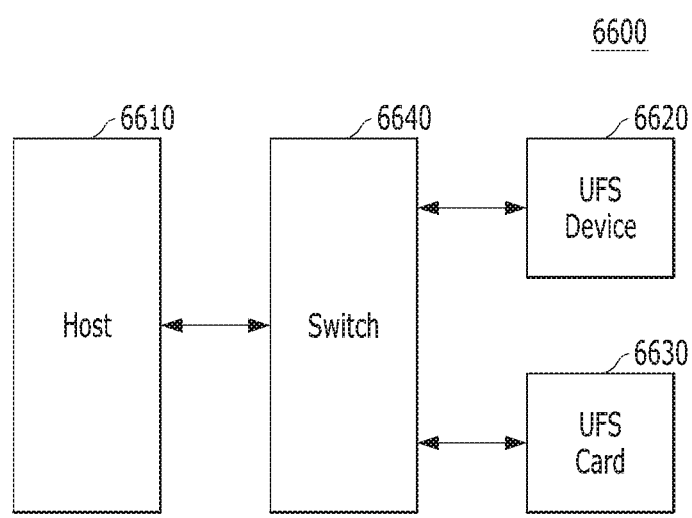

In the UFS system 6600 illustrated in FIG. 15, each of the host 6610, the UFS device 6620 and the UFS card 6630 may include UniPro. The host 6610 may communicate with the UFS device 6620 or the UFS card 6630 through a switching module 6640 performing a switching operation, for example, through the switching module 6640 which performs link layer switching at the UniPro, for example, L3 switching. The UFS device 6620 and the UFS card 6630 may communicate with each other through link layer switching of the switching module 6640 at UniPro. In the illustrated embodiment, one UFS device 6620 and one UFS card 6630 are connected to the switching module 6640. However, a plurality of UFS devices and UFS cards may be connected in parallel or in the form of a star to the switching module 6640. A plurality of UFS cards may be connected in series or in the form of a chain to the UFS device 6620.

Figure 16:
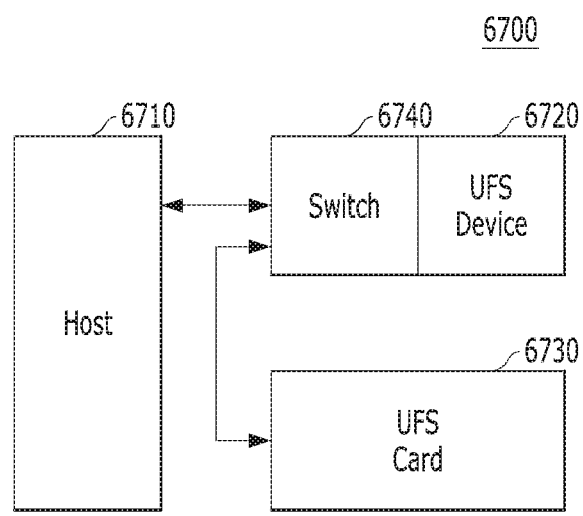

In the UFS system 6700 illustrated in FIG. 16, each of the host 6710, the UFS device 6720 and the UFS card 6730 may include UniPro. The host 6710 may communicate with the UFS device 6720 or the UFS card 6730 through a switching module 6740 performing a switching operation, for example, through the switching module 6740 which performs link layer switching at the UniPro, for example, L3 switching. The UFS device 6720 and the UFS card 6730 may communicate with each other through link layer switching of the switching module 6740 at the UniPro. The switching module 6740 may be integrated as one module with the UFS device 6720 inside or outside the UFS device 6720. In the illustrated embodiment, one UFS device 6720 and one UFS card 6730 are connected to the switching module 6740. However, a plurality of modules, each including the switching module 6740 and the UFS device 6720, may be connected in parallel or in the form of a star to the host 6710. In another example, a plurality of modules may be connected in series or in the form of a chain to each other. Furthermore, a plurality of UFS cards may be connected in parallel or in the form of a star to the UFS device 6720.

Figure 17:
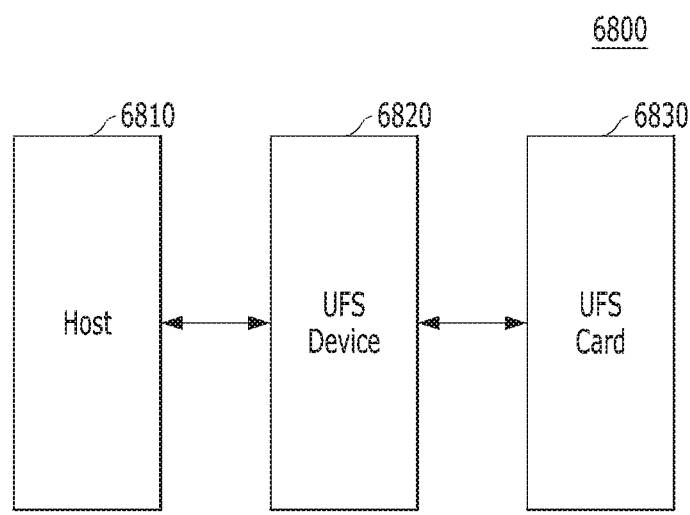

In the UFS system 6800 illustrated in FIG. 17, each of the host 6810, the UFS device 6820 and the UFS card 6830 may include M-PHY and UniPro. The UFS device 6820 may perform a switching operation to communicate with the host 6810 and the UFS card 6830. In particular, the UFS device 6820 may communicate with the host 6810 or the UFS card 6830 through a switching operation between the M-PHY and UniPro module for communication with the host 6810 and the M-PHY and UniPro module for communication with the UFS card 6830, for example, through a target identifier (ID) switching operation. The host 6810 and the UFS card 6830 may communicate with each other through target ID switching between the M-PHY and UniPro modules of the UFS device 6820. In the illustrated embodiment, one UFS device 6820 is connected to the host 6810 and one UFS card 6830 is connected to the UFS device 6820. However, a plurality of UFS devices may be connected in parallel or in the form of a star to the host 6810, or connected in series or in the form of a chain to the host 6810. A plurality of UFS cards may be connected in parallel or in the form of a star to the UFS device 6820, or connected in series or in the form of a chain to the UFS device 6820.

Figure 18:
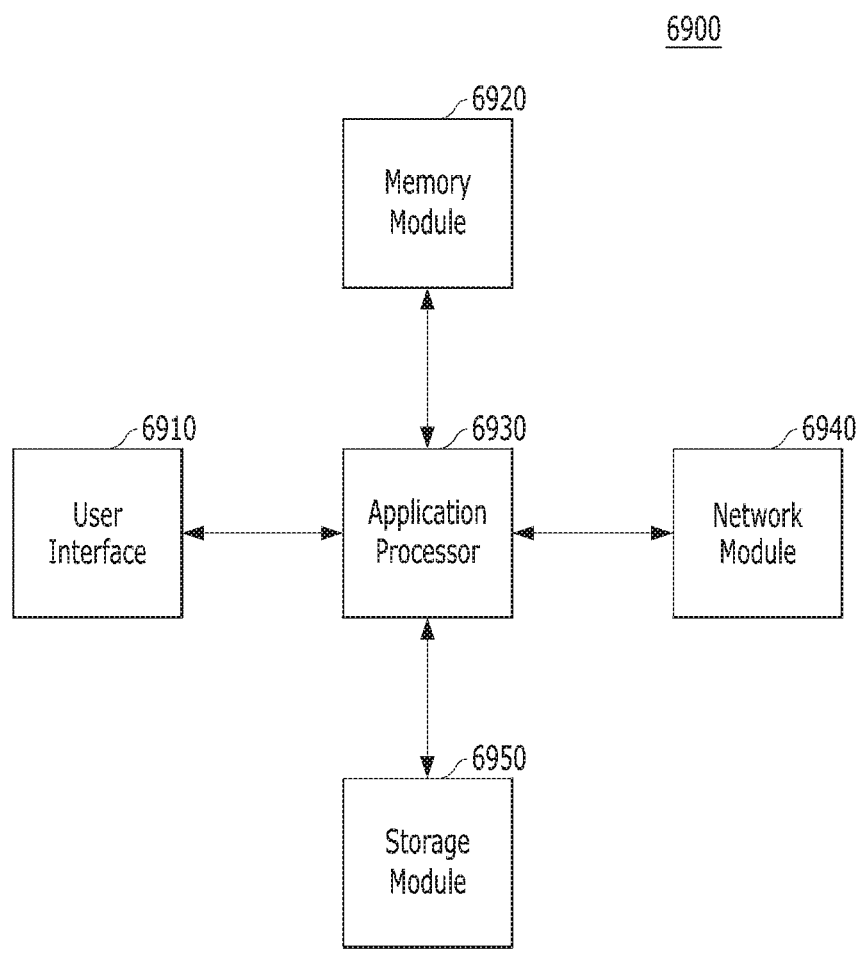

FIG. 18 is a diagram illustrating another example of a data processing system including a memory system in accordance with an embodiment of the present invention. For example, FIG. 18 is a diagram illustrating a user system 6900 to which the memory system may be applied.

Referring to FIG. 18, the user system 6900 may include a user interface 6910, a memory module 6920, an application processor 6930, a network module 6940 and a storage module 6950.

More specifically, the application processor 6930 may drive components in the user system 6900, for example, an operating system (OS), and include controllers, interfaces and a graphic engine which control the components included in the user system 6900. The application processor 6930 may be provided as System-on-Chip (SoC).

The memory module 6920 may be used as a main memory, work memory, buffer memory or cache memory of the user system 6900. The memory module 6920 may include a volatile random access memory (RAM) such as a dynamic RAM (DRAM), a synchronous DRAM (SDRAM), a double data rate (DDR) SDRAM, a DDR2 SDRAM, a DDR3 SDRAM, a low power DDR (LPDDR) SDARM, a LPDDR3 SDRAM or a LPDDR3 SDRAM or a nonvolatile RAM such as a phase-change RAM (PRAM), a resistive RAM (ReRAM), a magneto-resistive RAM (MRAM) or a ferroelectric RAM (FRAM). For example, the application processor 6930 and the memory module 6920 may be packaged and mounted, based on package on package (PoP).

The network module 6940 may communicate with external devices. For example, the network module 6940 may not only support wired communication, but also support various wireless communication protocols such as code division multiple access (CDMA), global system for mobile communication (GSM), wideband CDMA (WCDMA), CDMA-2000, time division multiple access (TDMA), long term evolution (LTE), worldwide interoperability for microwave access (WiMAX), wireless local area network (WLAN), ultra-wideband (UWB), Bluetooth, wireless display (WI-DI), thereby communicating with wired/wireless electronic devices, particularly mobile electronic devices. Therefore, the memory system and the data processing system, in accordance with an embodiment of the present invention, can be applied to wired/wireless electronic devices. The network module 6940 may be included in the application processor 6930.

The storage module 6950 may store data, for example, data received from the application processor 6930, and then may transmit the stored data to the application processor 6930. The storage module 6950 may be embodied by a nonvolatile semiconductor memory device such as a phase-change RAM (PRAM), a magnetic RAM (MRAM), a resistive RAM (ReRAM), a NAND flash, a NOR flash and a 3D NAND flash, and provided as a removable storage medium such as a memory card or external drive of the user system 6900. The storage module 6950 may correspond to the memory system 110 described with reference to FIG. 1. Furthermore, the storage module 6950 may be embodied as an SSD, an eMMC and an UFS as described above with reference to FIGS. 12 to 17.

The user interface 6910 may include interfaces for inputting data or commands to the application processor 6930, or outputting data to an external device. For example, the user interface 6910 may include user input interfaces such as a keyboard, a keypad, a button, a touch panel, a touch screen, a touch pad, a touch ball, a camera, a microphone, a gyroscope sensor, a vibration sensor and a piezoelectric element, and user output interfaces such as a liquid crystal display (LCD), an organic light emitting diode (OLED) display device, an active matrix OLED (AMOLED) display device, an LED, a speaker and a motor.

Furthermore, when the memory system 110 of FIG. 1 is applied to a mobile electronic device of the user system 6900, the application processor 6930 may control overall operations of the mobile electronic device, and the network module 6940 may serve as a communication module for controlling wired/wireless communication with an external device. The user interface 6910 may display data processed by the processor 6930 on a display/touch module of the mobile electronic device, or support a function of receiving data from the touch panel.

According to an embodiment of the present invention, a user may directly select a program mode of a flash memory in the data processing system, whenever an initialization operation is performed. When the user selects a single level cell (SLC) program mode, the speed of a program operation may be increased. When the user selects a multi-level cell program mode, the data capacity may be increased.

While the present invention has been described with respect to the specific embodiments, it will be apparent to those skilled in the art that various changes and modifications may be made without departing from the spirit and scope of the invention as defined in the following claims.

What is claimed is:

1. A data processing system, comprising:
a host including a program mode selection unit and an initialization determining unit, the host suitable for generating an initialization command and generating program mode information by receiving an initialization selection and a program mode selection determined by a user;
a memory device including a plurality of memory cells storing a single level data and a multiple-level data; and
a controller suitable for:
receiving the initialization command and the program mode information from the host;
controlling the memory device to perform an initialization operation on the memory device in response to the initialization command; and
controlling the memory device to perform a program operation on the memory device based on the program mode information after the initialization operation is performed,
wherein the initialization selection is determined by the user selecting an initialization button in the initialization determining unit of the host,
wherein the program mode selection is determined by the user selecting one of a plurality of buttons in the program mode selection unit of the host,
wherein a first button of the plurality of buttons corresponds to a single-level cell program mode, and a second button of the plurality of buttons corresponds to a multiple-level cell program mode, and
wherein the program mode is one of the single-level cell program mode for reliability and the multiple-level cell program mode for capacity.

2. The data processing system of claim 1, wherein the multi-level cell program mode includes a multi-level cell program mode, a triple-level cell program mode, and a quadruple-level cell program mode.

3. The data processing system of claim 1, wherein the single level cell program mode is a program mode for storing one-bit data into a memory cell.

4. The data processing system of claim 1, wherein the controller includes format performing unit suitable for performing a format operation of restoring to an initial state by deleting user data included in the memory device.

5. The data processing system of claim 1, wherein the plurality of buttons further includes a third button which corresponds to a triple level cell program mode and a fourth button which corresponds to a quadruple level cell program mode.

6. A method for operating a data processing system, comprising:
generating an initialization command and program mode information by a host including a program mode selection unit and an initialization determining unit, by receiving an initialization selection and a program mode selection determined by a user;
receiving the initialization command and the program mode information from the host by a controller;
performing an initialization operation on a memory device including a plurality of memory cells storing a single-level data and a multiple-level data, in response to the initialization command; and
performing a program operation on the memory device based on the program mode information after the initialization operation is performed,
wherein the initialization selection is determined by the user selecting an initialization button in the initialization determining unit of the host,
wherein the program mode selection is determined by the user selecting one of a plurality of buttons in the program mode selection unit of the host,
wherein a first button of the plurality of buttons corresponds to a single-level cell program mode, and a second button of the plurality of buttons corresponds to a multiple-level cell program mode, and
wherein the program mode is one of the single-level cell program mode for reliability and the multiple-level cell program mode for capacity.

7. The method of claim 6, wherein the multiple-level cell program mode includes a multi-level cell mode, a triple level cell mode, and a quadruple level cell mode.

8. The method of claim 6, wherein the single-level cell program mode is a program mode for storing one-bit data into a memory cell.

9. The method of claim 6, wherein the performing of the initialization operation on the memory device in response to the initialization command includes
performing a format operation of restoring to an initial state by deleting user data included in the memory device.

10. The method of claim 6, wherein the plurality of buttons further includes a third button which corresponds to a triple level cell program mode and a fourth button which corresponds to a quadruple level cell program mode.

* * * * *